(12) United States Patent  
Kashimura et al.

(10) Patent No.: US 11,456,199 B2  
(45) Date of Patent: Sep. 27, 2022

(54) MEASUREMENT METHOD AND MEASURING JIG

(71) Applicant: TOKYO ELECTRON LIMITED, Tokyo (JP)

(72) Inventors: Ryusei Kashimura, Miyagi (JP); Masanori Sato, Miyagi (JP); Tetsu Tsunamoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/728,161

(22) Filed: Dec. 27, 2019

(65) Prior Publication Data

US 2020/0211886 A1 Jul. 2, 2020

(30) Foreign Application Priority Data

Dec. 28, 2018 (JP) .............................. JP2018-248274

(51) Int. Cl.
*H01L 21/683* (2006.01)
*B23Q 17/00* (2006.01)
*H01L 21/67* (2006.01)

(52) U.S. Cl.
CPC ........ *H01L 21/6833* (2013.01); *B23Q 17/002* (2013.01); *H01L 21/67253* (2013.01)

(58) Field of Classification Search
CPC .......... H01L 21/6833; H01L 21/67253; B23Q 17/002
USPC ....................................................... 361/233
See application file for complete search history.

(56) References Cited

U.S. PATENT DOCUMENTS

| 5,280,156 | A | * | 1/1994 | Niori | ................ | H01L 21/67103 118/725 |
| 5,384,681 | A | * | 1/1995 | Kitabayashi | ............ | B32B 18/00 279/128 |
| 5,557,215 | A | * | 9/1996 | Saeki | .................. | H01L 21/6833 324/756.01 |
| 6,198,616 | B1 | * | 3/2001 | Dahimene | ........... | H01L 21/6831 279/128 |
| 7,737,702 | B2 | * | 6/2010 | Pipitone | ............. | C23C 16/4586 324/536 |
| 2004/0188021 | A1 | * | 9/2004 | Mitrovic | ............. | H01L 21/6833 156/345.52 |
| 2005/0225923 | A1 | * | 10/2005 | Howald | ............ | H01J 37/32082 361/234 |

(Continued)

FOREIGN PATENT DOCUMENTS

JP 07-211768 A 8/1995
JP 2001-308164 A 11/2001
(Continued)

*Primary Examiner* — Thienvu V Tran  
*Assistant Examiner* — Sreeya Sreevatsa  
(74) *Attorney, Agent, or Firm* — Weihrouch IP

(57) ABSTRACT

In a measurement method, a terminal is brought into contact with an electrode in an electrostatic chuck in contact with a substrate that is grounded. Further, the terminal, the electrostatic chuck and the substrate are fixed, and a current value and a voltage value are measured using an ammeter and a voltmeter, respectively, that are connected to the terminal. In addition, whether or not the terminal and the electrode are electrically connected is determined from a slope of the current value and/or a peak current value based on the measured current value and the voltage value.

10 Claims, 10 Drawing Sheets

(56) References Cited

U.S. PATENT DOCUMENTS

| | | | |
|---|---|---|---|
| 2007/0217118 A1* | 9/2007 | Ikuhara | H01L 21/6833 |
| | | | 361/234 |
| 2008/0153182 A1* | 6/2008 | Herchen | H01L 21/67173 |
| | | | 438/10 |
| 2008/0218931 A1* | 9/2008 | Hsu | H01L 21/67259 |
| | | | 361/234 |
| 2017/0278735 A1* | 9/2017 | Sugita | G01D 5/24 |

FOREIGN PATENT DOCUMENTS

| JP | 3771766 | B2 | * | 4/2006 | | |
|---|---|---|---|---|---|---|
| JP | 2007227562 | A | * | 9/2007 | ......... | H01L 21/6833 |
| KR | 20060100028 | A | * | 9/2006 | | |
| KR | 20060100028 | A | * | 9/2006 | | |
| KR | 20070074105 | A | * | 7/2007 | | |
| KR | 20070074105 | A | * | 7/2007 | | |
| KR | 20070074105 | A | * | 3/2008 | | |

* cited by examiner

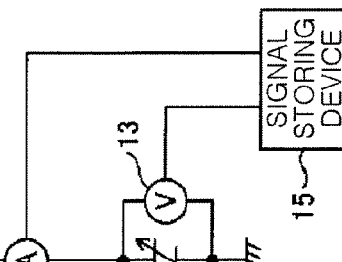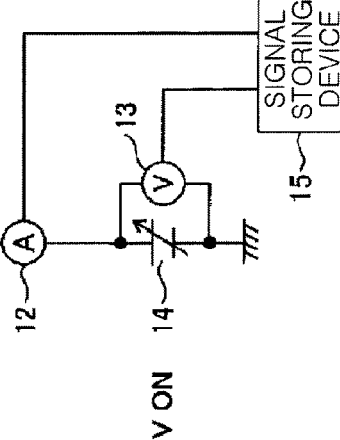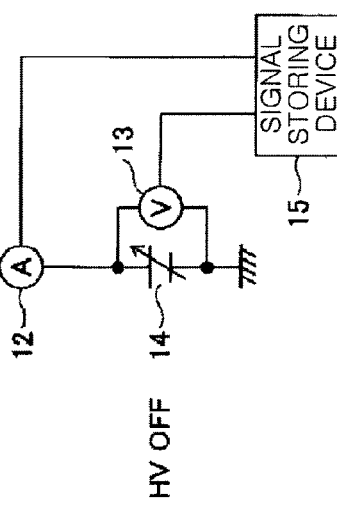
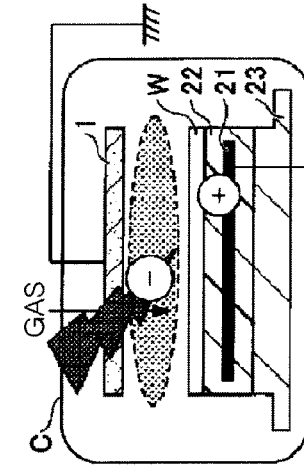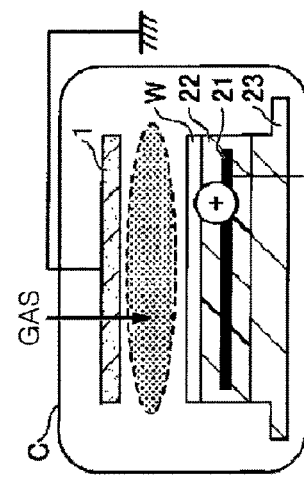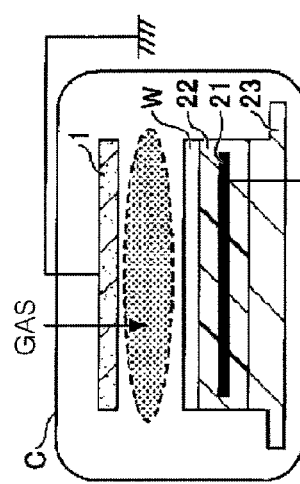
FIG.4A  FIG.4B  FIG.4C

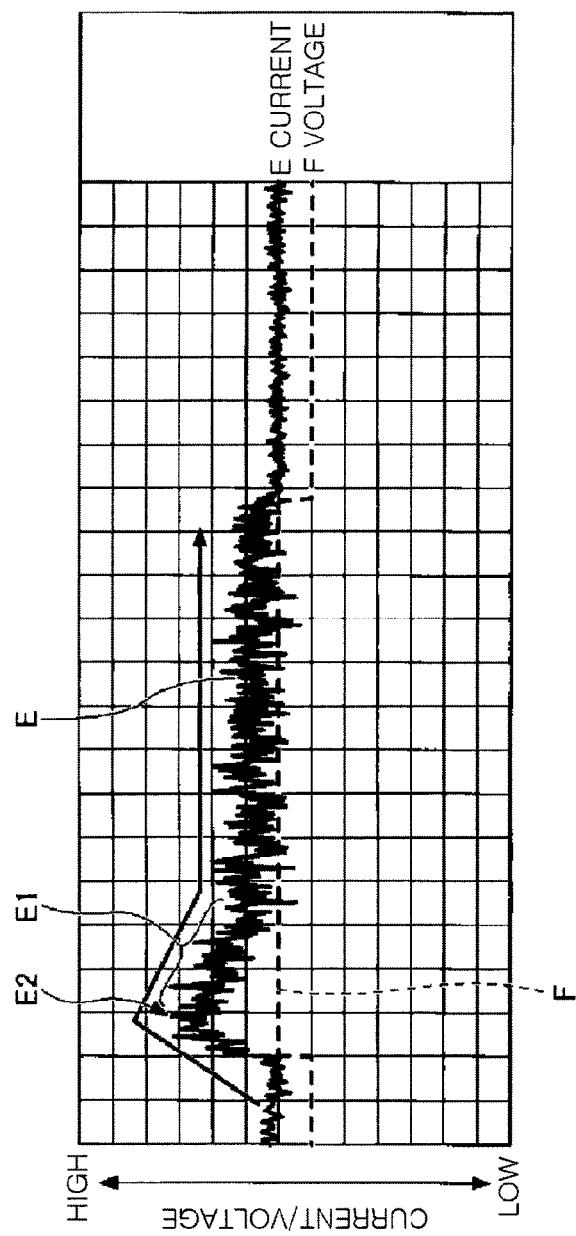

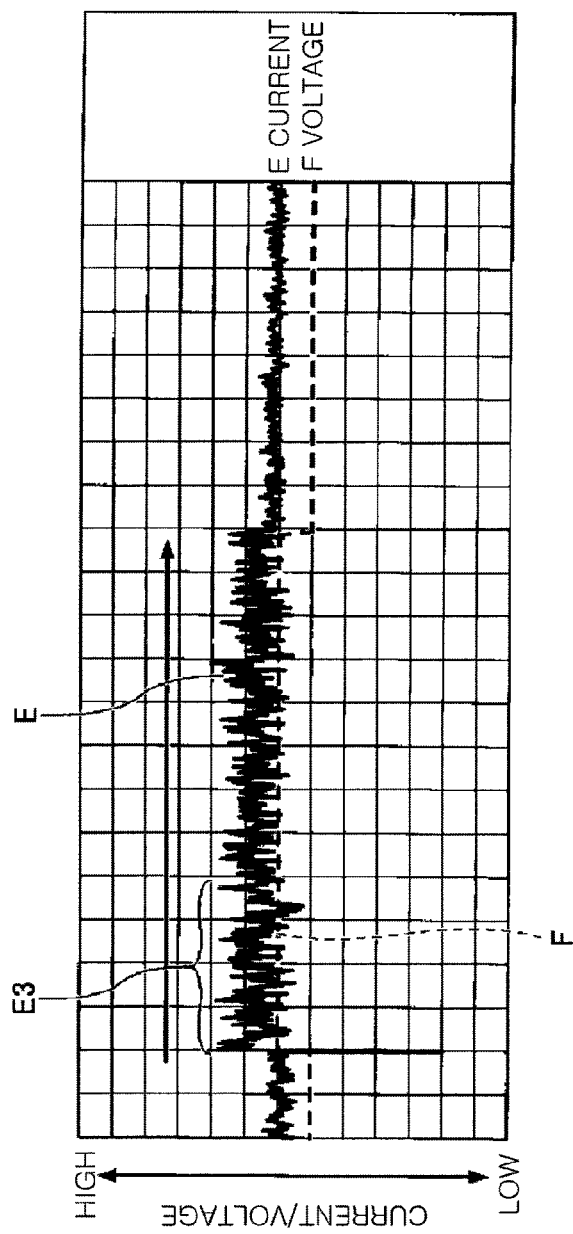

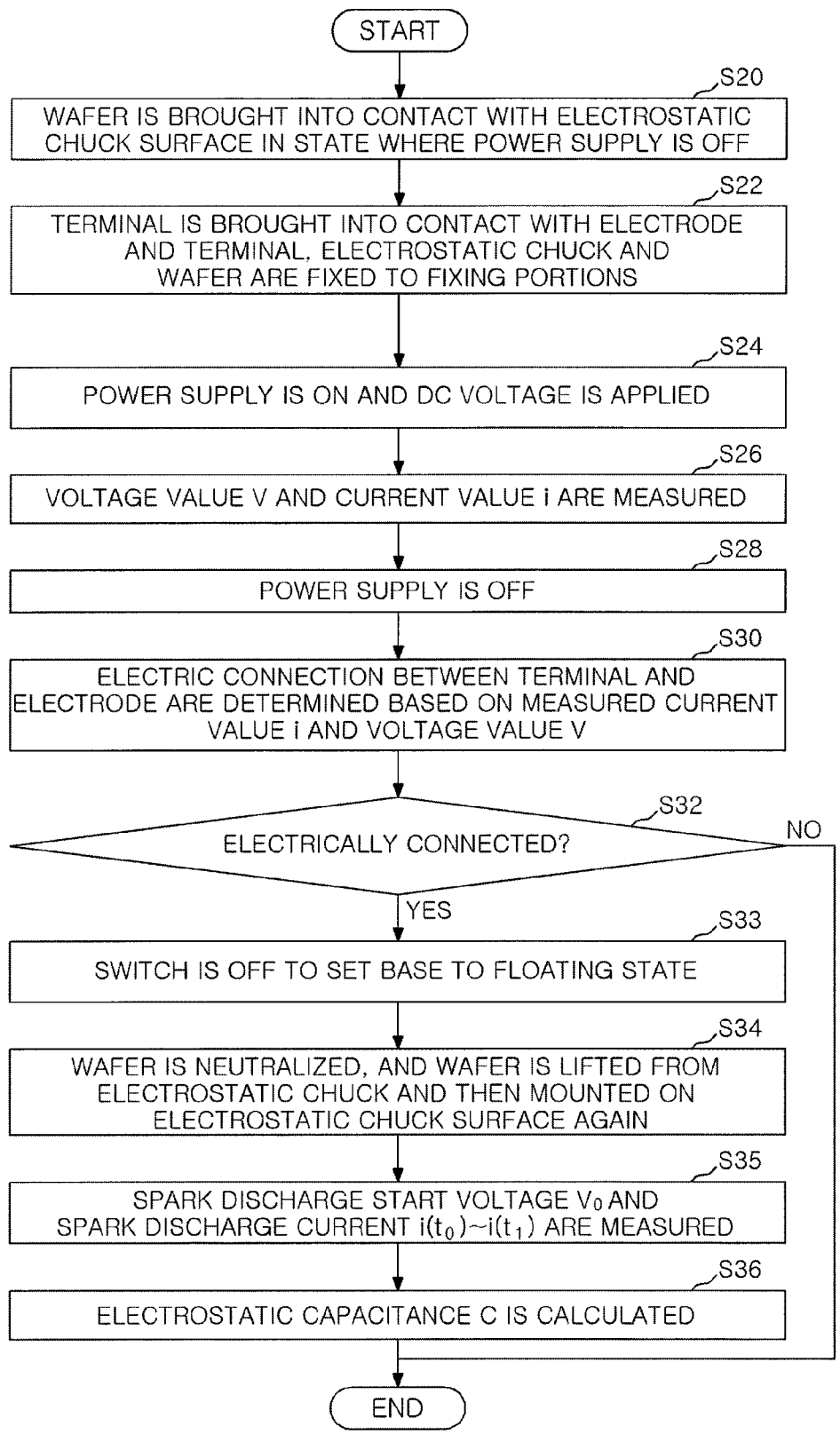

MEASUREMENT METHOD AND MEASURING JIG

CROSS-REFERENCE TO RELATED APPLICATIONS

This application claims priority to Japanese Patent Application No. 2018-248274, filed on Dec. 28, 2018, the entire contents of which are incorporated herein by reference.

TECHNICAL FIELD

The present disclosure relates to a measurement method and a measuring jig.

BACKGROUND

Conventionally, a method for measuring an electrostatic capacitance of an electrostatic chuck has been suggested. For example, Japanese Patent Application Publication No. H07-211768 discloses a method in which a detection device for detecting parameters indicating an attraction state is installed at an electric circuit formed by an electrode plate and an object to be held by an electrostatic attraction device, and the attraction state is checked by comparing data detected by the detection device and pre-stored data using a comparison circuit.

Further, for example, Japanese Patent Application Publication No. 2001-308164 discloses an apparatus including an electrostatic capacitance monitoring circuit for monitoring an electrostatic capacitance between a wafer and an electrode or between a plurality of electrodes in a chuck. In this apparatus, a measured electrostatic capacitance is used for continuous closed-loop control of a chuck operation and a voltage applied to the chuck is controlled depending on the measured electrostatic capacitance.

The present disclosure provides a new technique for measuring an electrostatic capacitance of an electrostatic chuck.

SUMMARY

In accordance with an aspect of the present disclosure, there is provided a measurement method including: bringing a terminal into contact with an electrode in an electrostatic chuck in contact with a substrate that is grounded; fixing the terminal, the electrostatic chuck, and the substrate; measuring a current value and a voltage value using an ammeter and a voltmeter, respectively, that are connected to the terminal, respectively; and determining whether or not the terminal and the electrode are electrically connected from a slope of the current value and/or a peak current value based on the measured current value and the voltage value.

BRIEF DESCRIPTION OF THE DRAWINGS

The objects and features of the present disclosure will become apparent from the following description of embodiments, given in conjunction with the accompanying drawings, in which:

FIGS. 4A to 4C explain a discharge start voltage measurement method according to the embodiment;

FIGS. 8A and 8B show examples of a terminal contact determination result according to the embodiment; and FIG. 9 is a flowchart of a terminal contact determination process and a discharge start voltage measurement process according to the embodiment.

DETAILED DESCRIPTION

Figure 1:
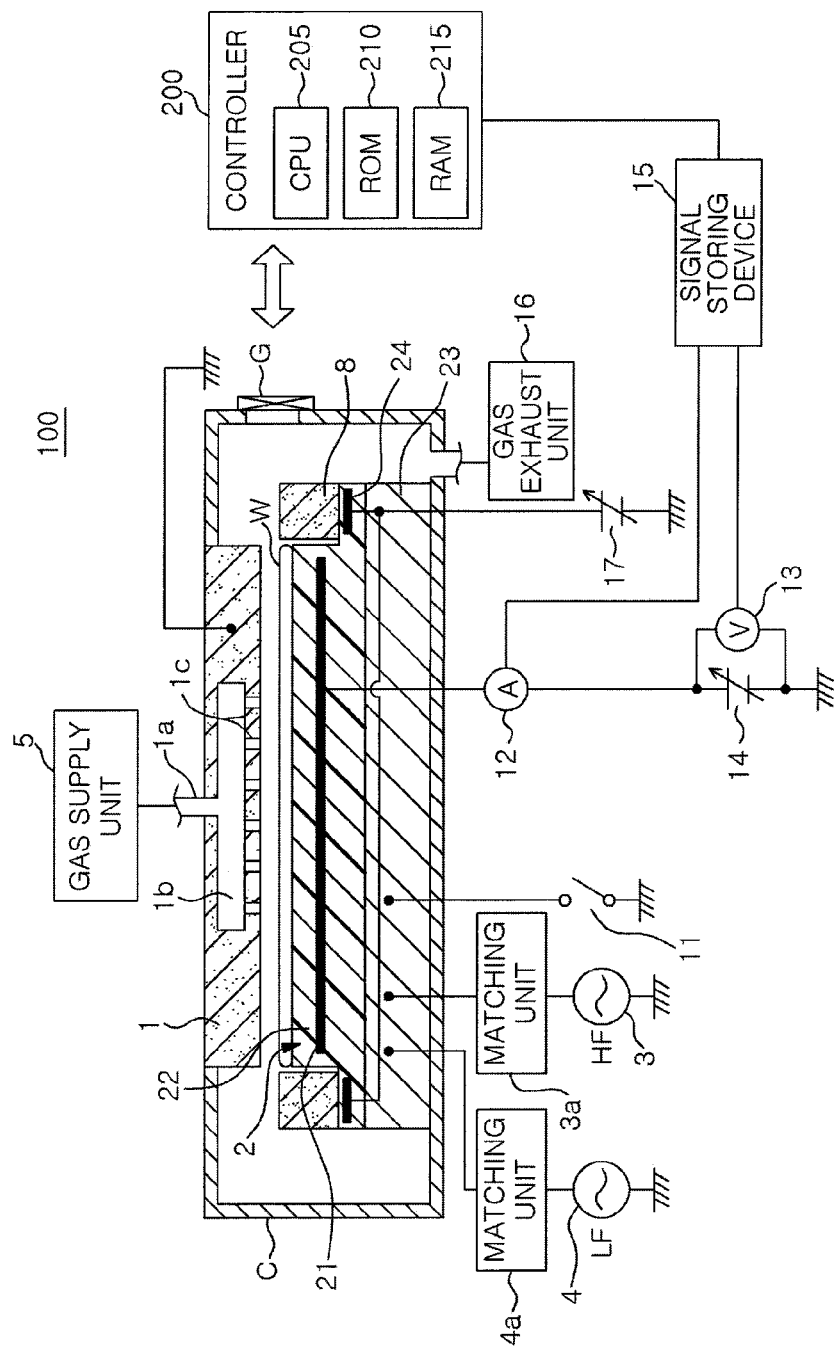
FIG. 1 is a schematic cross-sectional view showing a substrate processing apparatus according to an embodiment.

Hereinafter, embodiments will be described in detail with reference to the accompanying drawings. Like reference numerals will be given to like parts throughout the drawings, and redundant description thereof will be omitted.

<Substrate Processing Apparatus>

First, a configuration of a substrate processing apparatus 100 of the present embodiment will be described with reference to FIG. 1. FIG. 1 is a schematic cross-sectional view showing an example of the substrate processing apparatus according to the embodiment.

The substrate processing apparatus 100 of the present embodiment is a capacitively-coupled parallel-plate substrate processing apparatus, and has a substantially cylindrical chamber C. The chamber C has an alumite-treated (anodically oxidized) surface. The inside of the chamber C serves as a processing chamber in which plasma processing such as etching or the like is performed using plasma. A mounting table 2 is disposed at a bottom portion of the chamber C.

The mounting table 2 includes an electrostatic chuck 22 and a base 23. The base 23 is made of, e.g., aluminum (Al), titanium (Ti), silicon carbide (SiC), or the like. The electrostatic chuck 22 is disposed on the base 23 and attracts and holds the wafer W. The electrostatic chuck 22 has a structure in which an electrode 21 is embedded in a dielectric layer. The electrode 21 is connected to a power supply 14. When a DC voltage (hereinafter, also referred to as "DC voltage" or "HV voltage") is applied from the power supply 14 to the electrode 21, the wafer W is attracted to and held by the electrostatic chuck 22 by a Coulomb force.

A stepped portion is formed at an outer periphery of the electrostatic chuck 22 and serves as an edge ring mounting surface on which an edge ring 8 is mounted. The edge ring 8 having an annular shape is mounted on the edge ring mounting surface to surround the periphery of the wafer W. The edge ring 8 is also referred to as a focus ring. The edge ring 8 is made of, e.g., silicon, and converges plasma toward the surface of the wafer W to improve the efficiency of the plasma processing. The electrode 24 is disposed in the electrostatic chuck 22 below the edge ring mounting surface and is connected to a power supply 17. When a DC voltage is applied from the power supply 17 to the electrode 24, a thickness of a sheath above the edge ring 8 is controlled. Accordingly, it is possible to suppress tilting that occurs at an edge portion of the wafer W and control an etching rate.

The substrate processing apparatus 100 includes a first high frequency power supply 3 and a second high frequency power supply 4. The first high frequency power supply 3 generates a first high frequency power (HF) having a frequency suitable for plasma generation. The frequency of the first high frequency power is within a range of, e.g., 27 MHz to 100 MHz. The first high frequency power supply 3 is connected to the base 23 through a matching unit 3a. The matching unit 3a has a circuit for matching an output impedance of the first high frequency power supply 3 with an impedance of a load side (the base 23 side). The first high frequency power supply 3 may be connected to an upper electrode 1 through the matching unit 3a.

The second high frequency power supply 4 generates a second high frequency power (LF). The second high frequency power has a frequency lower than that of the first high frequency power. In the case of using both of the first high frequency power and the second high frequency power, the second high frequency power is used as a bias high frequency power for attracting ions into the wafer W. The frequency of the second high frequency power is within a range of, e.g., 400 kHz to 13.56 MHz. The second high frequency power supply 4 is connected to the base 23 through a matching unit 4a. The matching unit 4a has a circuit for matching an output impedance of the second high frequency power supply 4 with the impedance of the load side (the base 23 side).

The plasma may be generated using only one high frequency power, i.e., the second high frequency power without using the first high frequency power. In this case, the frequency of the second high frequency power may be higher than 13.56 MHz, e.g., 40 MHz. The substrate processing apparatus 100 may not include the first high frequency power supply 3 and the matching unit 3a. The mounting table 2 serves as a lower electrode disposed to be opposite to the upper electrode 1.

A switch 11 is connected to the base 23. When the switch 11 is turned on, the base 23 is grounded. When the switch 11 is turned off, the base 23 and the wafer W are in a floating state.

The upper electrode 1 is attached to block an opening formed at a ceiling portion of the chamber C through a shield ring (not shown) that coves an outer peripheral portion thereof. The upper electrode 1 is grounded. The upper electrode 1 may be made of silicon.

The upper electrode 1 has a gas inlet port 1a for introducing a gas and a diffusion space 1b for diffusing the gas. A gas supply unit 5 supplies a gas to the diffusion space 1b through the gas inlet port 1a. The gas is diffused in the diffusion space 1b and introduced into the chamber C from a plurality of gas injection holes 1c.

A gas exhaust unit 16 exhausts the gas in the chamber C from a gas exhaust port formed at the bottom surface of the chamber C. Accordingly, a pressure in the chamber C can be maintained at a predetermined vacuum level. A gate valve G is disposed on a sidewall of the chamber C. The gate valve G is opened so that the wafer W can be loaded into or unloaded from the chamber C.

Next, an operation of the substrate processing apparatus 100 will be briefly described. When the gate valve G is opened, the wafer W held by a transfer arm (not shown) is loaded into the chamber C and mounted on the mounting table 2, and the gate valve G is closed. When a DC voltage is applied from the power supply 14 to the electrode 21, the wafer W is electrostatically attracted to and held on the electrostatic chuck 22. When the processing gas is supplied from the gas supply unit 5 into the chamber C and the first high frequency power and the second high frequency power are respectively applied from the first high frequency power supply 3 and the second high frequency power supply 4 to the mounting table 2, plasma is generated above the wafer W in the chamber C and plasma processing is performed on the wafer W. Particularly, when the second high frequency power is applied from the second high frequency power supply 4 to the mounting table 2, ions in the plasma are attracted to the wafer W.

After the plasma processing, a DC voltage having the same magnitude but opposite polarity as that of the voltage applied from the power supply 14 to the electrode 21 before the plasma processing is applied to neutralize charges on the wafer W. Accordingly, the wafer W is separated from the electrostatic chuck 22 and transferred to the transfer arm while being held by pins. When the gate valve G is opened, the wafer W held on the transfer arm is unloaded from the chamber C through the gate valve G. Then, the gate valve G is closed.

The respective components of the substrate processing apparatus 100 are connected to and controlled by a controller 200. The respective components may include the gas exhaust unit 16, the matching units 3a and 4a, the first high frequency power supply 3, the second high frequency power supply 4, the switch 11, the power supplies 14 and 17, the gas supply unit 5, and the like.

The controller 200 is a computer including a CPU 205 and a memory such as a ROM 210, a RAM 215, or the like. The CPU 205 reads out and executes a processing recipe and a control program of the substrate processing apparatus 100 which are stored in the memory. The CPU 205 controls the plasma processing such as etching or the like.

Further, the controller 200 turns on and off the switch 11 at a predetermined measurement timing and stores a voltage value measured by a voltmeter 13 and a current value measured by an ammeter 12 connected to the electrode 21 in a signal storing device 15. The ammeter 12 is connected in series to the power supply 14, and the voltmeter 13 is connected in parallel to the power supply 14. The current value and the voltage value stored in the signal storing device 15 are transmitted to the controller 200. Accordingly, the controller 200 calculates a spark discharge start voltage value (hereinafter referred to as "discharge start voltage value") based on the measured current value and the measured voltage value. Then, the controller 200 calculates an electrostatic capacitance C of the electrostatic chuck 22 as will be described later.

A program for executing these operations or a recipe indicating processing conditions may be stored in a hard disk or a semiconductor memory. Further, the recipe may be set to a predetermined position while being stored in a portable computer-readable storage medium such as a CD-ROM, a DVD, or the like, and read out from the storage medium.

<Measurement Timing>

Figure 2:
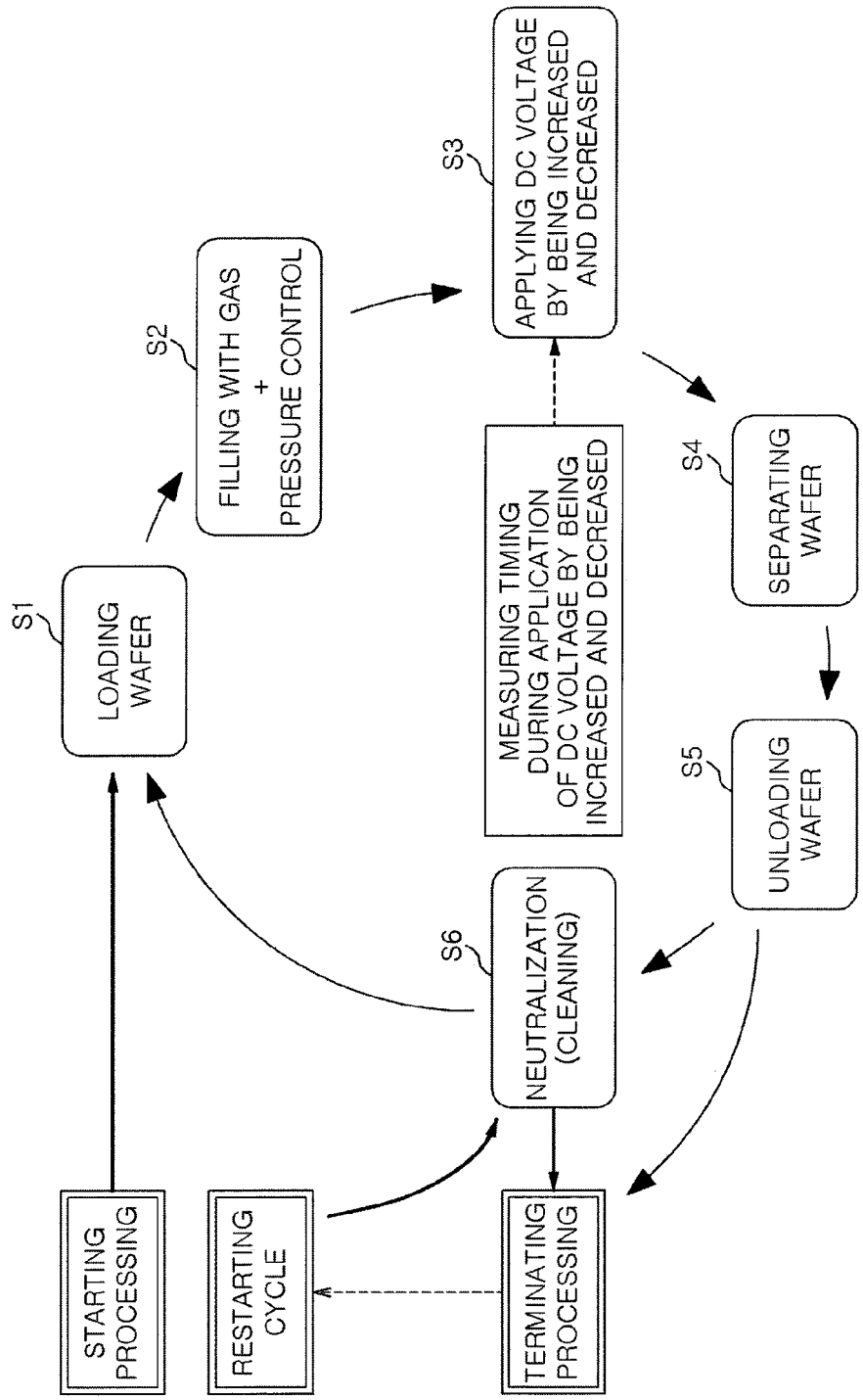
FIG. 2 shows a measurement timing of a discharge start voltage according to the embodiment.

FIG. 2 shows an example of a processing cycle for processing the wafer W in the substrate processing apparatus 100. When this processing is started, first, the gate valve G is opened and the wafer W is loaded (step S1). Next, a predetermined gas from the gas supply unit 5 fills the chamber C to control the pressure in the chamber C (step S2). The gas for filling the chamber C is preferably an inert gas such as argon gas or the like, but may be nitrogen gas or the like.

Next, the switch 11 is turned off; and the base 23 and the wafer W are set to a floating state; and a DC voltage is applied from the power supply 14 to the electrode 21 (step S3). During the process of step S3, the current value and the voltage value are measured and stored in the signal storing device 15. Next, the wafer W is separated from the electrostatic chuck 22 (step S4), and the wafer W is unloaded through the gate valve G (step S5).

At this timing, the processing of one wafer W is completed, and one processing cycle is completed. Before a processing cycle of a next wafer W2 is resumed, waferless dry cleaning (WLDC) is performed and the charges on the electrostatic chuck 22 are neutralized (step S6). The WLDC is merely an example of a process of neutralizing charges on the electrostatic chuck 22, and the charge neutralization is not limited thereto. In addition, cleaning such as surface treatment or the like of the electrostatic chuck 22 may be performed before the charge neutralization.

Then, the next wafer W is loaded (step S1), and the processes subsequent to step S1 are repeated.

The current value and the voltage value are not necessarily measured whenever one wafer is processed, and may be measured whenever several wafers are processed, or after the cleaning of the chamber C, or after the replacement of the parts in the chamber C.

<Measurement Sequence>

Figure 3:
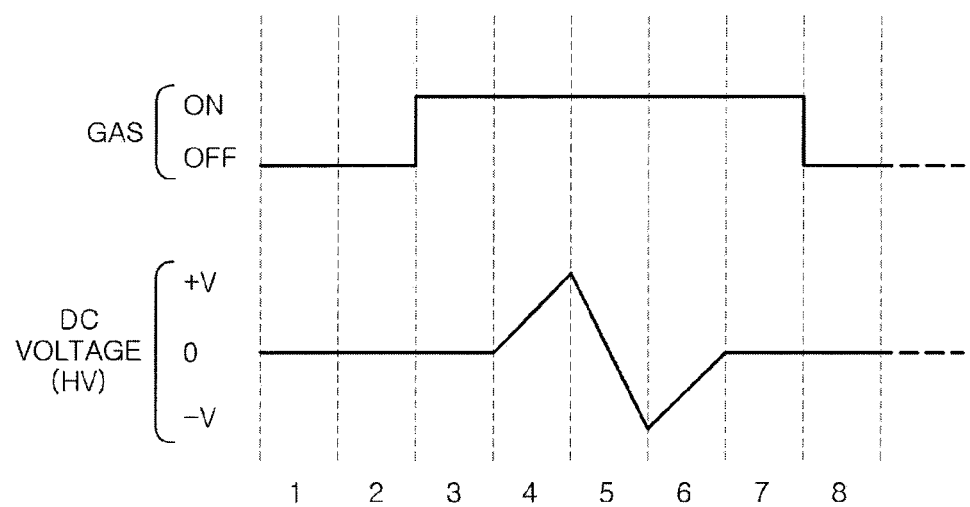
FIG. 3 shows a measurement sequence of the discharge start voltage according to the embodiment.

Next, an example of a sequence of measuring the current value and the voltage value will be described with reference to FIGS. 3 and 4. FIG. 3 shows a discharge start voltage measurement sequence according to the embodiment. FIGS. 4A to 4C explain a discharge start voltage measurement method according to the embodiment. The measurement sequence is controlled by the controller 200.

When the measurement sequence is started, the switch 11 is controlled to be off, and the base 23 and the wafer W are in a floating state. In this state, the measurement sequence is started at phase "1" in FIG. 3; a gas is supplied (ON) from the gas supply unit 5 at phase "2"; and the pressure in the chamber C is controlled by the supplied gas at phase "3".

FIG. 4A shows a state in which the gas is supplied into the chamber C and the pressure in the chamber C is controlled to a predetermined pressure. At this time, no DC voltage (HV voltage) is applied from the power supply 14 to the electrode 21.

Next, the application of a DC voltage from the power supply 14 to the electrode 21 is started at phase "4" in FIG. 3, and the applied DC voltage is increased from 0 [V] to +V [V]. When the phase "4" is started, the ammeter 12 and the voltmeter 13 start the measurement, and the current value measured by the ammeter 12 and the voltage value measured by the voltmeter 13 are stored in the signal storing device 15.

Next, at phase "5", the DC voltage applied from the power supply 14 to the electrode 21 is lowered from +V [V] to −V [V]. During the phase "5", the measurements of the ammeter 12 and the voltmeter 13 are continued, and the measured current value and the measured voltage value are stored in the signal storing device 15.

Next, at phase "6", the DC voltage applied from the power supply 14 to the electrode 21 is increased from −V [V] to 0 [V]. During the phase "6", the measurements of the ammeter 12 and the voltmeter 13 are continued, and the measured current value and the measured voltage value are stored in the signal storing device 15.

Accordingly, a positive DC voltage is applied to the electrode 21 during the phases "4" to "6" as shown in FIG. 4B, and spark discharge occurs between the upper electrode 1 and the chuck 22 as shown in FIG. 4C. The DC voltage applied to the electrode 21 during the phases "4" to "6" is not necessarily a positive voltage, and may be a negative voltage.

Next, the gas supply is stopped (OFF) at phase "7" in FIG. 3, and the measurement sequence is completed at phase "8".

In the above-described measurement sequence, the DC voltage is applied by increasing and decreasing the voltage. However, the present disclosure is not limited thereto. For example, the DC voltage may be applied by only increasing or only decreasing the voltage.

As described above, in the measurement method of the present embodiment, plasma is not generated and the pressure in the chamber C is controlled by supplying a gas. At this time, the gas exhaust operation of the gas exhaust unit 16 is not performed. When the application of the DC voltage is on and the DC voltage is increased and decreased to a certain voltage value, positive charges are accumulated on the electrode 21 of the electrostatic chuck 22. Accordingly, positive charges are accumulated on the surface of the wafer W.

Then, the DC voltage is increased to a voltage value at which spark discharge occurs. Negative charges are attracted to the wafer W by the spark discharge that occurs between the upper electrode 1 and the electrode 21. Accordingly, a current flows between the electrode 21 and the upper electrode 1. A current value and a voltage value at that time are measured by the ammeter 12 and the voltmeter 13, respectively.

<Measured Values>

Figure 5:
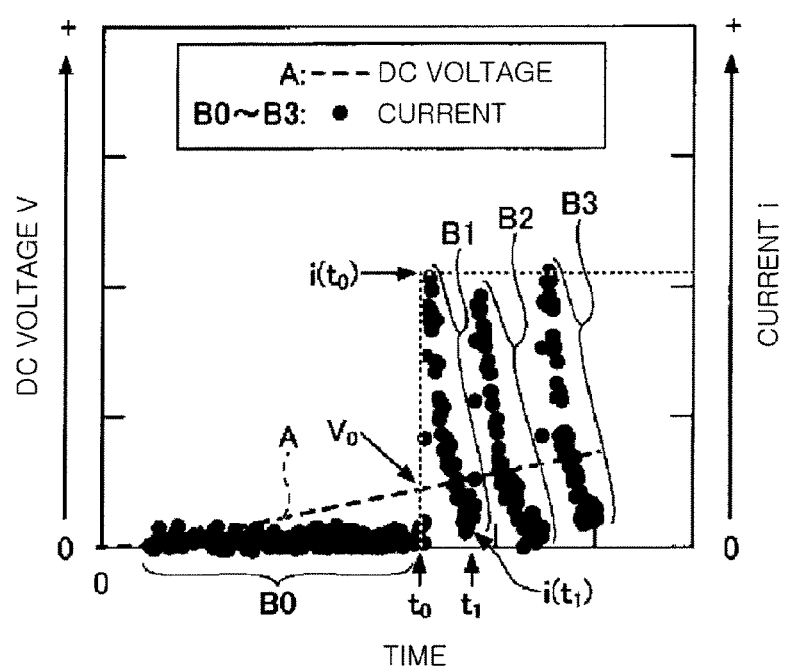
FIG. 5 shows examples of measured values of a voltage and a current according to the embodiment.

Examples of the measured current value and the measured voltage value will be described. Here, examples of the current value and the voltage value that are measured when the DC voltage is increased at the phase "4" in FIG. 3 will be described with reference to FIG. 5. FIG. 5 shows examples of the measured voltage value and the measured current value according to the embodiment.

The horizontal axis in FIG. 5 represents a measurement time in the case of setting a start time of the phase "4" in FIG. 3 to 0. The left side of the vertical axis represents a voltage value measured at the phase "4", and the right side of the vertical axis represents a current value measured at the phase "4". A line A in FIG. 5 indicates voltage values (ESC Vol) measured by the voltmeter 13 at the phase "4". Lines B0, B1, B2, and B3 in FIG. 5 indicate current values (ESC Cur) measured by the ammeter 12 at the phase "4."

The results shown in FIG. 5 shows that the spark discharge was started when the voltage value was $V_0$, and current values $i(t_0)$ to $i(t_1)$ were measured from a discharge start time $t_0$ to a discharge end time $t_1$ as indicated by the line B1. Then, as indicated by the lines B2 and B3, the measured current values were considerably decreased as in the case of the line B1.

From the above-described measurement results, it is clear that the electrical conduction between the electrostatic chuck 22 in a floating state and the grounded upper electrode 1 were instantaneously made due to the gas discharge (spark discharge) in the chamber C, and the discharge occurred between the upper electrode 1 and the electrode 21. In other words, in the present disclosure, the gas discharge is generated by generating a voltage difference between the electrostatic chuck 22 and the upper electrode 1 disposed to be opposite to the electrostatic chuck 22 by applying a positive or a negative DC voltage to the electrode 21.

The discharge start voltage value $V_0$ and the current values $i(t_0)$ to $i(t_1)$ measured from the discharge start time $t_0$ at which the discharge start voltage value $V_0$ was measured to the discharge end time $t_1$ are substituted into the following equation (1). Accordingly, a charge amount q of the electrostatic chuck 22 during the spark discharge can be calculated.

$$q = \int_{t_0}^{t_1} i(t)\, dt \quad (1)$$

Equation (1)

The, the electrostatic capacitance C of the electrostatic chuck 22 can be calculated from the following equation (2).

$$C = q/V_0 \qquad \text{Equation (2)}$$

Although the controller 200 in the present embodiment acquires the current value and the voltage value stored in the signal storing device 15 and calculates the electrostatic capacitance C based on the discharge start voltage value $V_0$ and the current values $i(t_0)$ to $i(t_1)$, the present disclosure is not limited thereto. For example, it is possible to substitute the current values i measured from the start to the end of the first discharge indicated by the line B1, the second discharge indicated by the line B2, and the third discharge indicated by the line B3 in FIG. 5 into the equation (1) to calculate respective charge amounts q and calculate an average of the three charge amounts q. The electrostatic capacitance C of the electrostatic chuck 22 can be calculated by substituting the average of the charge amounts q into the equation (2). By using the average of the charge amounts q, it is possible to suppress deterioration in the accuracy of the calculation result of the electrostatic capacitance C of the electrostatic chuck 22 due to variance in the measured current value and the measured voltage value.

<Attractive Force Determination Process>

Figure 6:
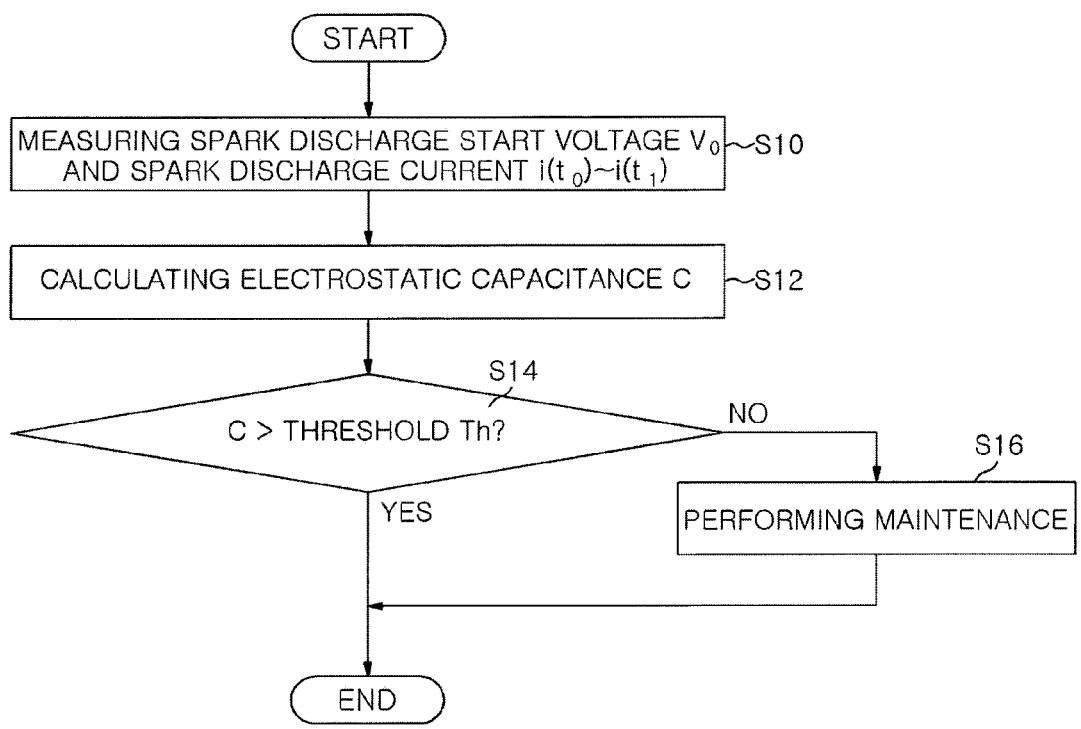
FIG. 6 is a flowchart of an attractive force determination process using an electrostatic capacitance according to the embodiment.

Next, an attractive force determination process using the calculated electrostatic capacitance C of the electrostatic chuck 22 will be described with reference to FIG. 6. FIG. 6 is a flowchart showing the attractive force determination process using the electrostatic capacitance according to the embodiment.

The attractive force determination process is controlled by the controller 200. Here, it is assumed that the current values and the voltage values are measured by the ammeter 12 and the voltmeter 13, respectively, while the DC voltage is applied from the power supply 14 to the electrode 21 by being increased and decreased and stored in the signal storing device 15.

When this process is started, the discharge start voltage value $V_0$ and the current values $i(t_0)$ to $i(t_1)$ that are the spark discharge currents flowing from the discharge start time $t_0$ at which the discharge start voltage value V0 is measured to the discharge end time $t_1$ are measured from the stored current values and the stored voltage values (step S10).

Next, the electrostatic capacitance C of the electrostatic chuck 22 is calculated using the discharge start voltage value $V_0$ and the spark discharge current values $i(t_0)$ to $i(t_1)$, and the equations (1) and (2) (step S12).

Next, it is determined whether or not the electrostatic capacitance C is greater than a predetermined threshold Th of the electrostatic capacitance (step S14). When it is determined that the electrostatic capacitance C is greater than the threshold Th, it is determined that the electrostatic chuck 22 has a sufficient attractive force, and this processing is terminated.

On the other hand, when it is determined that the electrostatic capacitance C is smaller than or equal to the threshold Th, it is determined that the electrostatic chuck does not have a sufficient attractive force, and the maintenance operation is performed by opening the lid of the chamber C (step S16). Then, this processing is terminated.

As described above, in accordance with the measurement method according to the embodiment, the state in the chamber can be determined based on the calculated electrostatic capacitance. For example, the attraction state between the electrostatic chuck 22 and the wafer W can be determined as an example of the state in the chamber. In addition, as will be described later, the attraction state between the electrostatic chuck 22 and the edge ring 8 can be determined as another example of the state in the chamber.

Therefore, when it is determined that the electrostatic capacitance C is smaller than or equal to the threshold Th, it is determined that the attraction state of the electrostatic chuck 22 is poor, and the maintenance operation is performed to improve the attraction state of the electrostatic chuck 22. For example, when it is determined that the electrostatic capacitance C is smaller than or equal to the threshold Th, waferless dry cleaning (WLDC) and/or waferless treatment (WLT) may be performed as the maintenance operation. In addition, the replacement of the electrostatic chuck 22 or other parts may be performed as the maintenance operation.

Although the gas discharge between the upper electrode 1 and the electrostatic chuck 22 was mainly described in the above-described electrostatic capacitance measurement method, the gas discharge is not limited thereto since a grounded member other than the upper electrode 1 is disposed in the chamber C. In other words, the gas discharge in the present embodiment is not limited to the gas discharge between the upper electrode 1 and the electrostatic chuck 22, and also includes the gas discharge between the electrostatic chuck 22 and a grounded member such as a sidewall of the chamber C, a deposition shield (not shown), a shutter (not shown), or the like.

In the present embodiment, the gas discharge is generated by applying a DC voltage from the power supply 14 to the electrode 21. However, the gas discharge may be generated by applying a DC voltage from the power supply 17 to the electrode 24 disposed in the electrostatic chuck 22 below the edge ring 8. In this case, the gas discharge may be generated by applying a DC voltage to the electrode 24 disposed in the electrostatic chuck 22 below the edge ring 8 in a state where the base 23 of the electrostatic chuck 22 and the edge ring 8 are in a floating state. Therefore, the electrostatic capacitance of the edge ring mounting surface of the electrostatic chuck 22 can be calculated. Accordingly, the attraction state between the edge ring 8 and the electrostatic chuck 22 can be determined. If it is determined that the attraction state is poor, the maintenance operation may be performed by opening the lid of the chamber C. As examples of the maintenance operation, the WLDC and/or the WLT may be performed, or the replacement of the electrostatic chuck 22 or other parts may be performed.

In the case of dividing the electrostatic chuck 22 into multiple zones and controlling each zone, the electrode 21 may be provided for each zone. In this case, the gas discharge may be generated by applying a DC voltage to each electrode. Therefore, the electrostatic capacitance of each zone of the electrostatic chuck 22 can be calculated. Accordingly, the attraction state of each zone of the electrostatic chuck 22 can be determined.

<Measuring Jig>

Figure 7:
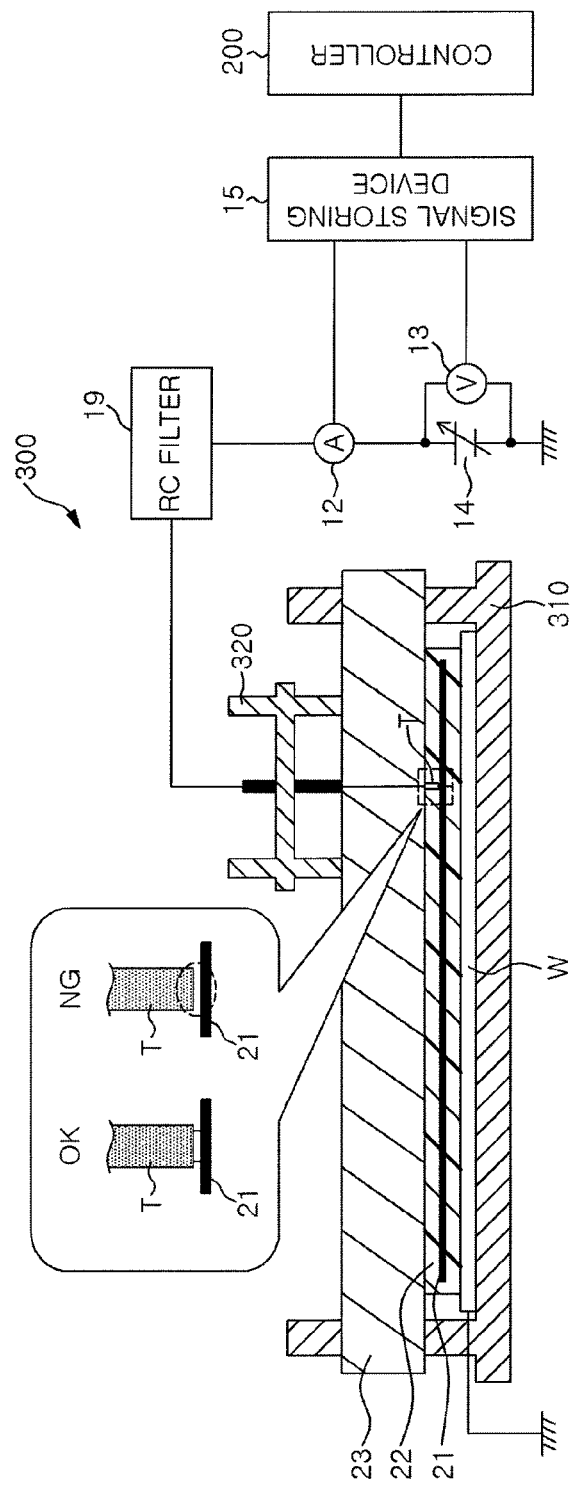
FIG. 7 shows a measuring jig according to the embodiment.

Next, a measuring jig 300 for measuring a discharge start voltage will be described with reference to FIG. 7. FIG. 7 shows a measuring jig according to the embodiment.

The measuring jig 300 measures a contact state between a terminal T and the electrode 21. The measuring jig includes the terminal T, fixing portions 310 and 320, the ammeter 12, the voltmeter 13, and the controller 200. First, a grounded wafer is brought into contact with the surface of the electrostatic chuck 22. Then, the grounded wafer W, the electrostatic chuck 22, and the base 23 are fixed to the fixing portion 310. Accordingly, the grounded wafer W is disposed below the electrostatic chuck 22, and the base 23 is disposed above the electrostatic chuck 22. The grounded wafer W is an example of a substrate that is connected to the ground. The substrate is not limited thereto, and may be made of a silicon-containing material or a metal.

FIG. 7 shows an example in which the electrostatic capacitance of the electrostatic chuck 22 is measured using the measuring jig 300 outside the substrate processing apparatus 100. However, the electrostatic capacitance of the electrostatic chuck 22 may be measured inside the substrate processing apparatus 100. In this case, the electrical conduction between the wafer W and the upper electrode 1 may be made by the gas discharge without directly connecting the wafer W to the ground.

The fixing portion 320 fixes the terminal T to the base 23 and brings the tip end thereof into contact with the electrode 21. The fixing portion 310 fixes the terminal T, the electrostatic chuck 22, and the wafer W. The ammeter 12 and the voltmeter 13 are connected to the terminal T. The ammeter 12 is connected in series to the power supply 14 and the voltmeter 13 is connected in parallel to the power supply 14.

The controller 200 measures the values of a voltage and a current flowing through the terminal T using the voltmeter 13 and the ammeter 12, respectively, and stores the measured current value and the measured voltage value in the signal storing device 15. The controller 200 determines whether or not the terminal T and the electrode 21 are electrically connected from a slope of the current value and/or the peak current value based on the measured current value and voltage value, thereby determining whether or not contact failure of the terminal T has occurred.

FIGS. 8A and 8B show examples of the determination result for the contact state of the terminal T according to the embodiment. As shown in FIG. 8A, when a slope E1 of a current value E while a voltage value F is controlled to be high is greater than or equal to a predetermined threshold, it is determined that the terminal T and the electrode 21 are in contact with each other as indicated by "OK" in the frame of FIG. 7, or when a peak current value E2 while the voltage value F is controlled to be high is greater than a predetermined value, it is determined that the terminal T and the electrode 21 are in contact with each other.

On the other hand, as shown in FIG. 8B, when a slope E3 of the current value E while the voltage value F is controlled to be high is smaller than the predetermined threshold and when the peak current value is smaller than the predetermined value, it is determined that the terminal T and the electrode 21 are not in contact with each other as indicated by "NG" in the frame of FIG. 7.

An RC filter 19 is connected between the terminal T and the ammeter 12. The RC filter 19 cuts off a current in a predetermined frequency band. Since the electrostatic chuck 22 serves as a capacitor, it is possible to eliminate the influence of noise and a time constant of the electrostatic chuck and clearly display a current waveform of the terminal T by installing the RF filter 19. However, the installation of the RC filter 19 is optional so that the RC filter 19 may not be provided.

The measuring jig 300 configured as described above is used to determine whether or not the terminal T is in contact with the electrode 21 before the application of the discharge start voltage value $V_0$. When it is determined that the terminal T is in contact with the electrode 21, the electrostatic capacitance of the electrostatic chuck 22 can be accurately calculated by measuring the discharge start voltage value $V_0$.

<Terminal Contact Determination Process and Discharge Start Voltage Value Measurement Process>

Next, the process of determining the contact state of the terminal T and the process of measuring the discharge start voltage value $V_0$ will be described with reference to FIG. 9. FIG. 9 is a flowchart of a terminal contact determination process and a discharge start voltage value measurement process according to the embodiment.

When this process is started, a wafer is brought into contact with the surface of the electrostatic chuck 22 in a state where the power supply 14 is turned off (step S20). Next, the tip end of the terminal T is brought into contact with the electrode 21 of the electrostatic chuck 22, and the terminal T, the electrostatic chuck 22, and the wafer W are fixed to the fixing portions 310 and 320 (step S22).

Next, the power supply 14 is turned on, and a predetermined DC voltage is applied to the electrode 21 by increasing and decreasing the voltage (step S24). Next, a voltage value V and a current value i flowing through the terminal T are measured by the voltmeter 13 and the ammeter 12, respectively (step S26). Next, the power supply 14 is turned off (step S28).

Next, based on the measured current value i and the measured voltage value V, it is determined whether or not the terminal T and the electrode 21 are electrically connected from the slope of the current value i and/or the peak current value i (steps S30 and S32).

If it is determined in step S32 that the terminal T and the electrode 21 are not electrically connected, the process is terminated without measuring the discharge start voltage value $V_0$. On the other hand, if it is determined in step S32 that the terminal T and the electrode 21 are electrically connected, the switch 11 is turned off to set the base 23 to a floating state (step S33). Next, the charges on the wafer W are neutralized using plasma or the like, and the wafer W is lifted from the electrostatic chuck 22 and mounted on the surface of the electrostatic chuck 22 again (step S34). Then, a gas is supplied into the chamber C and the discharge start voltage value $V_0$ and the current values $i(t_0)$ to $i(t_1)$ during the gas discharge generation are measured (step S35).

Next, the charge amount q is calculated by substituting the measured discharge start voltage value $V_0$ and the measured current values $i(t_0)$ to $i(t_1)$ into the equation (1). Then, the electrostatic capacitance C of the electrostatic chuck 22 is calculated by substituting the calculated charge amount q and the discharge start voltage value $V_0$ into the equation (2) (step S36). Then, this processing is terminated.

As described above, the measuring jig and the discharge start voltage measurement method of the present embodiment can provide a new technique for measuring an electrostatic capacitance of an electrostatic chuck.

The measuring jig and the measurement method according to the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

The substrate processing apparatus of the present disclosure can be applied to any substrate processing apparatus using capacitively coupled plasma (CCP), inductively coupled plasma (ICP), a radial line slot antenna (RLSA), electron cyclotron resonance plasma (ECR), or helicon wave plasma (HWP).

The DC voltage applied to the electrode 21 from the power supply 14 may be a positive DC voltage or a negative DC voltage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A measurement method comprising:
   mounting a substrate on an electrostatic chuck;
   supplying a gas into a space above the substrate within a chamber;
   measuring a discharge start voltage value and a current value while a gas discharge is generated in the chamber without generation of plasma;
   calculating an electrostatic capacitance of the electrostatic chuck from the measured discharge start voltage value and the measured current value; and
   comparing the calculated electrostatic capacitance of the electrostatic chuck with a predetermined threshold of the electrostatic capacitance and determining a state in the chamber based on the comparison result.

2. A measurement method of claim 1, further comprising:
   determining whether or not an electrode in the electrostatic chuck and a terminal brought into contact with the electrode are electrically connected from a slope of the current value and/or a peak current value based on the measured discharge start voltage value and the measured current value.

3. The measurement method of claim 2, wherein the substrate is made of a silicon-containing material or a metal, and is grounded.

4. The measurement method of claim 2, further comprising:
   providing an RC filter between the terminal and an ammeter that measure the current value and cutting off a current in a predetermined frequency band.

5. The measurement method of claim 1, wherein the gas discharge is generated by applying a voltage to an electrode in the electrostatic chuck in a state where a base of the electrostatic chuck and the substrate on the electrostatic chuck are in a floating state.

6. The measurement method of claim 1, wherein the gas discharge is generated by generating a voltage difference between the electrostatic chuck and an upper electrode disposed to be opposite to the electrostatic chuck.

7. The measurement method of claim 1, wherein a substrate attractive force of the electrostatic chuck is determined based on the comparison result.

8. The measurement method of claim 1, wherein whether or not it is necessary to perform cleaning and/or treatment is determined based on the comparison result.

9. The measurement method of claim 1, wherein the gas is an inert gas.

10. A measurement method comprising:
    mounting a substrate on an electrostatic chuck;
    supplying a gas into a space above the substrate within a chamber; and
    measuring a discharge start voltage value and a current value while a gas discharge is generated in the chamber without generation of plasma,
    wherein the electrostatic chuck is divided into multiple zones, and an electrostatic capacitance of each of the multiple zones is calculated,
    wherein the gas discharge is generated by applying a voltage to an electrode disposed in the electrostatic chuck below an edge ring mounted on an edge ring mounting surface of the electrostatic chuck in a state where a base of the electrostatic chuck and the edge ring are in a floating state, and an electrostatic capacitance of the edge ring mounting surface of the electrostatic chuck is calculated.

* * * * *